United States Patent
Nomoto et al.

(10) Patent No.: US 6,372,415 B1
(45) Date of Patent: *Apr. 16, 2002

(54) RESIST DEVELOPER

(75) Inventors: Shogo Nomoto; Akimitsu Sakai; Kozo Kitazawa, all of Wakayama (JP)

(73) Assignee: Kao Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/181,621

(22) Filed: Oct. 28, 1998

(30) Foreign Application Priority Data

| Oct. 30, 1997 | (JP) | 9-298360 |
| Feb. 26, 1998 | (JP) | 10-045525 |
| Mar. 11, 1998 | (JP) | 10-059534 |

(51) Int. Cl.⁷ .................................................. G03F 7/32
(52) U.S. Cl. ........................................ 430/331; 430/329
(58) Field of Search .................................. 430/329, 331

(56) References Cited

U.S. PATENT DOCUMENTS

| 4,039,371 A | * | 8/1977 | Brunner ................. 156/668 |
| 4,820,621 A | | 4/1989 | Tanka et al. ............ 430/331 |
| 5,106,724 A | * | 4/1992 | Nogami ................... 430/331 |
| 5,279,918 A | * | 1/1994 | Nishi ...................... 430/190 |
| 5,378,585 A | * | 1/1995 | Watanabe ................ 430/176 |
| 5,837,425 A | | 11/1998 | Nakanishi et al. |
| 5,972,862 A | * | 10/1999 | Torii ....................... 510/175 |

FOREIGN PATENT DOCUMENTS

| JP | 59142547 | 8/1984 |
| JP | 62175738 | 8/1987 |
| JP | 6325650 | 2/1988 |
| JP | 7333863 | 12/1995 |
| WO | WO 8400826 | 3/1984 |

OTHER PUBLICATIONS

Derwent Abstracts, JP 5–073228, Oct. 13, 1993.
Derwent Abstracts, JP 60–223120, Nov. 7, 1985.

* cited by examiner

*Primary Examiner*—Mark F. Huff
*Assistant Examiner*—Nicole Barreca
(74) *Attorney, Agent, or Firm*—Oblon, Spivak, McClelland, Maier & Neustadt, P.C.

(57) ABSTRACT

A resist developer comprising (1) a basic organic compound A and (2) a salt C of (a) a basic compound A' and (b) an organic compound B capable of forming a salt together with said basic compound A', wherein said basic compound A' is the same or different from said basic organic compound A, and wherein said resist developer is prepared by combining (1) and (2), or by reacting an excess amount of said basic organic compound A with said organic compound B.

13 Claims, No Drawings

RESIST DEVELOPER

BACKGROUND OF THE INVENTION

1. Field of the Invention

The present invention relates to a resist developer, and more particularly to a resist developer which can be suitably used for forming an image (a pattern) from a positive or negative resist such as an azide compound-type resist or a chemical amplification-type resist.

2. Discussion of the Related Art

Conventionally, it has been required in the field of the art relating to lithography employed in the production of semiconductor devices and liquid crystal display devices that the dissolution selectivity of a photoresist and uniformity of fine patterns formed from the photoresist are improved. In order to satisfy the above requirement, as a positive or negative resist, there has been developed a high resolution resist such as an azide compound-type resist or a chemical amplification-type resist, the base resin of which is an alkali-soluble polymer. Also, as a developer for the resist, an aqueous solution of a quaternary ammonium hydroxide has been proposed.

The aqueous solution of a quaternary ammonium hydroxide, however, cannot be appropriately used as a developer in the field of the art requiring high resolution since the aqueous solution does not form fine patterns of a resist due to its poor dissolution selectivity.

In order to improve the dissolution selectivity of a resist, there has been proposed a developer prepared by mixing an aqueous solution of a quaternary ammonium hydroxide with an alkylene oxide compound as disclosed in Japanese Examined Patent Publication Nos. Hei 6-38159 and Hei 5-73228, and Japanese Patent Laid-Open No. Sho 60-223120. The proposed developer, however, does not satisfy the required dissolution selectivity to a resist.

An object of the present invention is to provide a resist developer showing excellent dissolution selectivity, which promotes the solubility of a resist to be dissolved and inhibits the solubility of a resist not to be dissolved to form uniform fine resist patterns corresponding to the fine patterns of its resist mask.

Another object of the present invention is to provide a resist developer which develops a resist in a short period of time.

These and other objects of the present invention will be apparent from the following description.

SUMMARY OF THE INVENTION

In accordance with the present invention, there is provided
(A) a resist developer prepared from
  (1) at least one compound selected from a basic organic compound A and an organic compound B capable of forming a salt together with a basic compound, and/or
  (2) a salt C of the basic organic compound A and the organic compound B capable of forming a salt together with the basic compound;
(B) a resist developer comprising a salt C of a basic organic compound A and an organic compound B capable of forming a salt together with a basic compound; and
(C) a method for developing a resist, comprising using the resist developer according to the above (A) or (B).

DETAILED DESCRIPTION OF THE INVENTION

The resist developer of the present invention is prepared from
  (1) at least one compound selected from a basic,organic compound A and an organic compound B capable of forming a salt together with a basic compound (hereinafter merely referred to as "organic compound B"), and/or
  (2) a salt C formed from the basic organic compound A and the organic compound B.

The salt C formed from the basic organic compound A and the organic compound B is intended to mean that the salt C is composed of a salt of the basic organic acid A and the organic acid B, and/or a dissociated substance generated from the salt C.

The starting material used for the developer of the present invention includes, for instance, a combination of the basic organic compound A and the organic compound B; the salt C; a combination of the basic organic compound A, the organic compound B and the salt C; and a combination of the basic organic compound A and the salt C. The developer can be easily prepared, for instance, by dissolving the starting material in water.

The developer includes the salt C, and moreover may include the basic organic compound A and/or the organic compound B.

Representative examples of the basic organic compound A include ammonia, primary amines, secondary amines, tertiary amines, imines, alkanol amines, amides, basic heterocyclic compounds, quaternary ammonium hydroxides, and the like. Those compounds can be used alone or in admixture thereof.

Concrete examples of the basic organic compound A include ammonia; primary amines such as ethylamine, n-propylamine, n-butylamine and 1,3-diaminopropane; secondary amines such as diethylamine, di-n-propylamine, di-n-butylamine and 4,4'-diaminodiphenylamine; tertiary amines such as n,n-dimethylethylamine, n,n-diethylmethylamine and triethylamine; imines such as bis(dialkylamino)imine; alkanol amines such as monoethanolamine, diethanolamine, triethanolamine, diethylethanolmine and propanolamine; amides such as formamide and acetoamide; basic heterocyclic compounds having at least one hetero-atom selected from nitrogen atom, oxygen atom and sulfur atom in its ring structure having 3 to 5 carbon atoms, such as pyrrole, pyrrolidine, pyrrolidone, pyridine, morpholine, pyrazine, piperidine, oxazole and thiazole; a quaternary ammonium hydroxide represented by the formula (II):

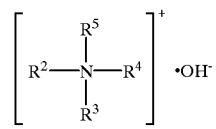

(II)

wherein each of $R^2$, $R^3$, $R^4$ and $R^5$ is independently an alkyl group having 1 to 6 carbon atoms, an aralkyl group having 7 or 8 carbon atoms, an alkenyl group having 2 to 6 carbon atoms, an aryl group having 6 to 8 carbon atoms, a hydroxyalkyl group having 1 to 6 carbon atoms or an alkoxyalkyl group having 2 to 6 carbon atoms; and the like.

Concrete examples of the quaternary ammonium hydroxide represented by the formula (II) include tetramethylammonium hydroxide (hereinafter referred to as "TMAH"), tetraethylammonium hydroxide, tetrabutylammonium hydroxide, tributylammonium hydroxide, trimethylhydroxyethylammonium hydroxide (hereinafter refereed to as "choline"), tetraethanolammonium hydroxide, methyltriethanolammonium hydroxide, and the like. Among them, from the viewpoint of dissolution selectivity, the quaternary ammonium hydroxide is preferable. Also, it is desirable that each of $R^2$, $R^3$, $R^4$ and $R^5$ in the formula (II) has 1 to 4 carbon atoms, preferably 1 or 2 carbon atoms, respectively. In particular, TMAH and choline are most preferable.

The term "dissolution selectivity" described herein is intended to mean a nature which promotes the solubility of the region of a resist to be dissolved, and which inhibits the solubility of the region of a resist not to be dissolved. For instance, when a positive resist is developed with the resist developer, the region of the resist to which ultraviolet rays, far ultraviolet rays, excimer lasers, X-rays or electron beams are irradiated, corresponds to the region of a resist to be dissolved, and the region of the resist to which any rays are not irradiated, corresponds to the region of a resist not to be dissolved.

Examples of the basic compound capable of forming a salt together with the organic compound B include the basic organic compound A and a basic inorganic compound. Examples of the basic inorganic compound include, for instance, sodium hydroxide, pottasium hydroxide, calcium hydroxide, and the like.

Concrete examples of the organic compound B include organic compounds having carboxyl group, thiocarboxyl group, dithiocarboxyl group, sulfo group, sulfino group or sulfeno group, and salts formed from the organic compound and the basic inorganic compound.

Concrete examples of the organic compound B further include ethers, esters, amides and imides, which have carboxyl group, thiocarboxyl group, dithiocarboxyl group, sulfo group, sulfino group or sulfeno group in their molecules, and salts formed from those compounds and the basic inorganic compound.

Examples of the ether, the ester, the amide and the imide include esters prepared by reacting a polycarboxylic acid, a polythiocarboxylic acid or a polydithiocarboxylic acid with an alcohol or an alkylene oxide adduct thereof; amides, imides or esters prepared by reacting a polycarboxylic acid, a polythiocarboxylic acid or a polydithiocarboxylic acid with an amine or an alkylene oxide adduct thereof; and the like.

Examples of the alcohol and the alkylene oxide adduct thereof include a linear saturated alcohol, a branched saturated alcohol, a linear unsaturated alcohol, a branched unsaturated alcohol, an alcohol having an aromatic ring, an alcohol having an alicyclic ring or a heterocyclic ring, a polyhydric alcohol, ethyleneoxide and/or propyleneoxide adducts thereof, and the like.

Examples of the amine and the alkylene oxide adduct thereof include a linear saturated amine, a branched saturated amine, a linear unsaturated amine, a branched unsaturated amine, an amine having an aromatic ring, an amine having an alicyclic ring or a heterocyclic ring, a polyamine, ethyleneoxide and/or propylene oxide adducts thereof, and the like.

Concrete examples of the organic compound B include acidic inorganic acid esters such as a carbonic acid ester, a sulfuric acid ester and a phosphoric acid ester, a complex compound of a basic acid ester, a salt of the acidic inorganic acid ester and the basic inorganic compound, and a salt of the complex compound of a boric acid ester and the basic inorganic compound.

Concrete examples of the organic compound B include an organic acid, and a salt of the organic acid and the basic organic compound. Examples of the organic acid include a carboxylic acid, a thiocarboxylic acid, a dithiocarboxylic acid, a peracid, mercaptan, sulfonic acid, sulfinic acid, sulfenic acid, phosphonic acid, phosphatidic acid, phosphine, and the like.

The organic compound B is preferably an organic compound having carboxyl group, thiocarboxyl group or dithiocarboxyl group in its molecule, or a salt of the organic compound and the basic inorganic compound, more preferably an organic compound having carboxyl group in its molecule or a salt of the organic compound and the basic inorganic compound, furthermore preferably a carboxylic acid or a salt thereof, particularly preferably a carboxylic acid from the viewpoint of dissolution selectivity.

As the carboxylic acid, there can be cited, for instance, at least one carboxylic acid selected from the group consisting of a linear saturated monocarboxylic acid, a linear unsaturated monocarboxylic acid, a branched saturated monocarboxylic acid, a branched unsaturated monocarboxylic acid, a saturated polycarboxylic acid, an unsaturated polycarboxylic acid, a hydroxycarboxylic acid, an aminocarboxylic acid, an alkoxycarboxylic acid, a carboxylic acid having an aromatic ring, a carboxylic acid having an alicyclic ring and a carboxylic acid having a heterocyclic ring.

It is desirable that the molecular weight of the carboxylic acid is 46 to 10000, preferably 46 to 1000, and more preferably 46 to 200 from the viewpoint of dissolution selectivity.

Also, in order to more improve the dissolution selectivity, it is desirable that the carboxylic acid is represented by the formula (I):

$$A{-}[(R^1)_k{-}(COOH)_m]_n \qquad (I)$$

wherein $R^1$ is hydrogen atom, a saturated or unsaturated hydrocarbon group having a linear, branched or cyclic skeleton of 1 to 40 carbon atoms; the hydrocarbon group of $R^1$ may have 1 to 5 oxygen atoms, nitrogen atoms or sulfur atoms; hydrogen atom bonded to carbon atom of $R^1$ may be substituted with —OH group, —$NH_2$ group, —SH group or —$NO_2$ group; each of —COOH groups may be bonded to the same carbon atom of $R^1$; k is 0 or 1; m is an integer of 1 to 40; n is an integer of 1 to 3; A is —O— group, —CO— group, —NH— group, —S— group or

group, or is not presented; with proviso that in a case where A is presented, n is 2 or 3, and that in a case where A is not presented, n is 1.

It is desirable that $R^1$ is an alkylene group having 1 to 20 carbon atoms, an alkyl group having 1 to 20 carbon atoms, an aralkyl group having 7 to 20 carbon atoms, an alkenyl group having 2 to 20 carbon atoms, an aryl group having 6 to 20 carbon atoms or an alkoxyalkyl group having 2 to 20 carbon atoms.

When A is not presented in the formula (I), concrete examples of the carboxylic acid include linear saturated monocarboxylic acids having 1 to 18 carbon atoms such as formic acid, acetic acid and propionic acid; linear unsaturated monocarboxylic acids such as acrylic acid, crotonic acid, vinylacetic acid, 4-pentenoic acid, 6-heptenoic acid, 2-octenoic acid, undecylenic acid and oleic acid; branched saturated monocarboxylic acids such as isobutyric acid, isovaleric acid, pivalic acid, 2-methylbutyric acid, 2-methylvaleric acid, 2,2-dimethylbutyric acid, 2-ethylbutyric acid, tert-butylbutyric acid, 2,2-dimethylpentanoic acid, 2-ethylpentanoic acid, 2-methylhexanoic acid, 2-ethylhexanoic acid, 2,4-dimethylhexanoic acid, 2-methylheptanoic acid, 2-propylpentanoic acid, 3,5,5-trimethylhexanoic acid, 2-methyloctanoic acid, 2-ethylheptanoic acid, 2-ethyl-2,3,3-trimethylbutyric acid, 2,2,4,4-tetramethylpentanoic acid and 2,2-diisopropyl propionic acid; branched unsaturated monocarboxylic acids such as methacrylic acid, tiglic acid, 3,3-dimethylacrylic acid, 2,2-dimethyl-4-pentenoic acid, 2-ethyl-2-hexenoic acid and citronellic acid; saturated polycarboxylic acids such as oxalic acid, malonic acid, methylmalonic acid, ethylmalonic acid, dimethylmalonic acid, succinic acid, methylsuccinic acid, 2,2-dimethylsuccinic acid, glutaric acid, adipic acid, 3-methyladipic acid, sebacic acid, hexadecanedionic acid, 1,2,3-propanetricarboxylic acid, 1,2,3,4-butanetetracarboxylic acid, polyacrylic acid and polymaleic acid; unsaturated polycarboxylic acids such as maleic acid, fumaric acid, citraconic acid, mesaconic acid, cis-aconitic acid and trans-aconitic acid; hydroxycarboxylic acids such as lactic acid, gluconic acid, tartaric acid, malic acid and citric acid; aminocarboxylic acids such as glicine, DL-alanine, 4-aminobutyric acid, DL-3-aminobutyric acid and sarcosine; alkoxycarboxylic acids such as methoxyacetic acid and ethoxyacetic acid; carboxylic acids having an aromatic ring such as benzoic acid, terephthalic acid, trimellitic acid and naphthoic acid; carboxylic acids having an alicyclic ring such as cyclohexanecarboxylic acid, cyclohexanepropionic acid, cyclohexanebutyric acid and cyclopentanecarboxylic acid; carboxylic acids having a heterocyclic ring such as furoic acid, thenoic acid and nicotinic acid; and the like.

Also, when A is presented in the formula (I), concrete examples of the carboxylic acid include diglycolic acid, thiodiglycolic acid, 4,6-dioxoheptanoic acid, iminodiacetic acid and nitrilotriacetic acid.

Among those carboxylic acids, from the viewpoint of dissolution selectivity, it is desired that $R^1$ in the formula (I) is hydrogen atom, a linear saturated hydrocarbon group having 1 to 18 carbon atoms, a branched saturated hydrocarbon group having 3 to 18 carbon atoms, a linear unsaturated hydrocarbon group having 2 to 18 carbon atoms, a branched unsaturated hydrocarbon group having 3 to 18 carbon atoms, a saturated or unsaturated hydrocarbon group having an alicyclic group of 3 to 18 carbon atoms, or a saturated or unsaturated hydrocarbon group having an aromatic ring of 6 to 18 carbon atoms. Moreover, $R^1$ is preferably a linear saturated hydrocarbon group having 1 to 12 carbon atoms, a branched saturated hydrocarbon group having 3 to 12 carbon atoms, a linear unsaturated hydrocarbon group having 2 to 12 carbon atoms, a branched unsaturated hydrocarbon group having 3 to 12 carbon atoms, a saturated or unsaturated hydrocarbon group having an alicyclic ring having 3 to 12 carbon atoms, or a saturated or unsaturated hydrocarbon group having an aromatic ring of 6 to 12 carbon atoms. In particular, $R^1$ is most preferably a linear saturated hydrocarbon group having 1 to 6 carbon atoms, a branched saturated hydrocarbon group having 3 to 6 carbon atoms, a linear unsaturated hydrocarbon group having 2 to 6 carbon atoms, a branched unsaturated hydrocarbon group having 3 to 6 carbon atoms, a saturated or unsaturated hydrocarbon group having an alicyclic ring of 3 to 6 carbon atoms, or a saturated or unsaturated hydrocarbon group having an aromatic ring of 6 to 8 carbon atoms.

When the hydrocarbon group of $R^1$ has oxygen atom, nitrogen atom or sulfur atom, it is desirable that each number of those atoms is 1 or 2, respectively.

In the formula (I), from the viewpoint of dissolution selectivity, it is desirable that m is an integer of 1 to 40, preferably an integer of 1 to 20, more preferably an integer of 1 to 12, most preferably an integer of 1 to 6.

Examples of the thiocarboxylic acid include o-thioacetic acid and hexanebis(thioic acid). Examples of the dithiocarboxylic acid include dithiobenzoic acid. Examples of an ester having carboxyl group include monoethyl succinate and acetylsalicylic acid. Examples of an amide having carboxyl group include oxaminic acid and DL-alanyl-DL-alanine.

The salt C which is contained in the developer can be prepared, for instance, by (A) a method comprising adding the salt C formed from the basic organic compound A and the organic compound B to water, (B) a method comprising adding the basic organic compound A and the organic compound B to water to form the salt C, (C) a method comprising adding a salt formed from the basic inorganic compound and the organic compound B to a developer containing the basic organic compound A, and substituting an anion constituting the salt contained in the developer with an anion constituting the basic organic compound A and the like to form the salt C. Among those methods, the above methods (A) and (B) are preferable as compared with the above method (C) from the viewpoint of the prevention of circuits from corrosion due to a metal derived from the basic inorganic compound.

It is desirable to use a salt formed form a preferable basic organic compound selected from the basic organic compounds A and a preferable organic compound selected from the organic compounds B as the salt C, from the viewpoint of dissolution selectivity.

It is desirable that each solubility of the organic compound B and the salt C to 100 parts by weight of a 2% by weight TMAH aqueous solution at 25° C. is at least 0.001 parts by weight, preferably at least 0.05 parts by weight, more preferably 0.1 parts by weight, from the viewpoint of dissolution selectivity. Also, it is desirable that the first dissociation constant of pKa of the organic compound B at 25° C. is 0.1 to 10, preferably 0.5 to 6 from the viewpoint of dissolution selectivity.

It is desirable that the sum of the content of the basic organic compound A and the content of the basic organic compound A constituting the salt C in the developer is at least 0.5% by weight, preferably at least 1% by weight, more preferably at least 1.5% by weight from the viewpoint that the dissolution of a region of a resist to be dissolved is accelerated. Also, it is desirable that the sum is at most 20% by weight, preferably at most 10% by weight, more preferably at most 5.5% by weight from the viewpoint that the dissolution of a region of a resist not to be dissolved is inhibited. Moreover, the sum is preferably 0.5 to 20% by weight, more preferably 1 to 10% by weight, most preferably 1.5 to 5.5% by weight.

The content of the basic organic compound A in the developer is preferably 0.1 to 19.5% by weight, more preferably 0.5 to 10% by weight, most preferably 1.5 to 2.5% by weight from the viewpoint of dissolution selectivity.

It is desirable that the sum of the content of the organic compound B and the content of the organic compound B constituting the salt C in the developer is 0.001 to 15% by weight, preferably 0.001 to 4% by weight, more preferably 0.05 to 2% by weight, most preferably 0.05 to 1% by weight from the viewpoint of dissolution selectivity.

It is desirable in the developer that the ratio of the sum of the equivalent of the basic organic compound A and the equivalent of the basic organic compound A constituting the salt C to the sum of the equivalent of the organic compound B and the equivalent of the organic compound B constituting the salt C is 1:0.001 to 1:0.80, preferably 1:0.005 to 1:0.60, more preferably 1:0.01 to 1:0.50 from the viewpoint of dissolution selectivity.

Also, it is desirable in the developer that the ratio of the equivalent of the basic organic compound A to the sum of the equivalent of the organic compound B and the equivalent of the organic compound B constituting the salt C is 1:0.001 to 1:4, preferably 1:0.005 to 1:1.5, more preferably 1:0.01 to 1:1, from the viewpoint of dissolution selectivity.

It is desirable that the content of the salt C in the developer is 0.001 to 34.5% by weight, preferably 0.01 to 15% by weight, more preferably 0.05 to 10% by weight, most preferably 0.01 to 5% by weight from the viewpoint of dissolution selectivity.

When the developer contains the basic organic compound A and the salt C, each content of the basic organic compound A, the organic compound B constituting the salt C and the basic organic compound A constituting the salt C in the developer respectively can be determined, for instance, by the following method.

The developer is titrated with two-tenth normal (0.2N) alcohol-hydrochloric acid standard solution by means of a potentiometric titration apparatus, and the total amine value (KOHmg/g) is determined by a known method prescribed, for instance, in ASTM D2073-66, and the like.

Since the developer contains the salt C, when the developer is titrated with the alcohol-hydrochloric acid standard solution, the resulting pH titration curve shows at least two inflection points.

The minimum amine value among the total amine values obtained is regarded as amine value of the basic organic compound A (KOHmg/g) in the developer.

The difference between the maximum amine value and the minimum value is regarded as amine value (KOHmg/g) of the basic organic compound A constituting the salt C in the developer.

Thereafter, the total amine value of the basic organic compound A itself is measured by the above method.

Also, the acid value (KOHmg/g) of the organic compound B itself is measured by a known method such as a method prescribed in JIS K 0070 (1992).

The content (% by weight) of the basic organic compound A in the developer, the content (% by weight) of the organic compound B constituting the salt C in the developer, and the content (% by weight) of the basic organic compound A constituting the salt C in the developer can be determined by the following equations.

[The content (% by weight) of the basic organic compound A in the developer]=[The minimum amine value (KQHmg/g) in the developer]÷[The total amine value (KOHmg/g) of the basic organic compound A itself]×100

[The content (% by weight) of the organic compound B constituting the salt C in the developer]=[The amine value (KOHmg/g) of the basic organic compound A constituting the salt C in the developer]÷[The acid value (KOHmg/g) of the organic compound B itself]×100

[The content (% by weight) of the basic organic compound A constituting the salt C in the developer]=[The amine value (KOHmg/g) of the basic organic compound A constituting the salt C in the developer]÷[The total amine value (KOHmg/g) of the basic organic compound A itself]×100

Also, when an alkylene oxide compound is incorporated in the developer, the dissolution selectivity can be improved, and the development can be accelerated. The alkylene oxide compound described herein means a compound prepared by adding an alkylene oxide to a compound having active hydrogen, such as an alcohol, a phenolic compound, an amine or a carboxylic acid, or a derivative thereof.

Concrete examples of the alcohol include linear saturated alcohols such as methanol, ethanol, n-propanol, n-butanol, n-pentanol, hexyl alcohol, n-octanol and n-dodecanol; branched saturated alcohols such as 2-methyl-1-propanol, neopentyl alcohol, amyl alcohol, 3-methyl-1-pentanol and 2-ethyl-1-hexanol; linear unsaturated alcohols such as allyl alcohol, crotyl alcohol and oleyl alcohol; branched unsaturated alcohols such as 2-methyl-2-propene-1-ol and 4-methyl-3-pentene-1-ol; alcohols having an aromatic ring such as benzyl alcohol; alcohols having an alicyclic ring or a heterocyclic ring such as cyclohexanol, cyclohexyl methanol, cyclooctanol, decahydro-2-naphthol and furfuryl alcohol; polyhydric alcohols such as ethylene glycol, 1,3-propanediol, 1,4-butanediol, glycerol, pentaerythritol, arabitol and sorbitol; and the like.

Examples of the phenolic compound include phenol, o-crezol, nonyl phenol, and the like.

Examples of the amine include linear saturated amines such as ethylamine, propylamine, octylamine and dodecylamine; branched saturated amines such as isopropylamine and tert-butylamine; linear unsaturated amines such as allylamine and oleylamine; amines having an aromatic ring such as aniline, n-methylaniline, p-toluidine and benzylamine; amines having an alicyclic ring or a heterocyclic ring such as cyclopropylamine, cyclohexylamine and furfurylamine; polyamines such as ethylenediamine, diethylenetriamine and triethylenetetramine; and the like.

Examples of the carboxylic acid include, for instance, the same carboxylic acid as used in the organic compound B as explained above, such as a linear saturated monocarboxylic acid, a linear unsaturated monocarboxylic acid, a branched saturated monocarboxylic acid, a branched unsaturated monocarboxylic acid, a saturated polycarboxylic acid, an unsaturated polycarboxylic acid, hydroxycarboxylic acid, aminocarboxylic acid, alkoxycarboxlic acid, a carboxylic acid having an aromatic ring and a carboxylic acid having an alicyclic ring or a heterocyclic ring.

Examples of the alkylene oxide used as a starting material of the alkylene oxide compound include ethylene oxide and propylene oxide. Those compounds can be used alone or in admixture thereof. Also, those compounds can be adducts thereof in the form such as a random form or a block form.

Among the alkylene oxide compounds, it is preferable to use a compound represented by the formula (III):

wherein $R^6$ is hydrogen atom, an alkyl group having 1 to 18 carbon atoms, an aralkyl group having 7 to 18 carbon atoms, an alkenyl group having 2 to 18 carbon atoms, or an aryl group having 6 to 18 carbon atoms; $Y^1$ is —O— group, —COO— group or

group; A is at least one of ethylene group and propylene group; r is an integer of 1 to 60; $Y^2$ is —CO— group or is not presented; $R^7$ is hydrogen atom, an alkyl group having 1 to 18 carbon atoms or an alkenyl group having 2 to 18 carbon atoms; p is 1 or 2; q is 1 or 2; and with the proviso that $Y^1$ is —O— group or —COO— group, the sum of p and q is 2, and with the previso that $Y^1$ is

group, the sum of p and q is 3, from the viewpoint of dissolution selectivity.

It is desirable that $R^6$ is hydrogen atom, an alkyl group having 1 to 12 carbon atoms, an aralkyl group having 7 to 12 carbon atoms, an alkenyl group having 2 to 12 carbon atoms or an aryl group having 6 to 12 carbon atoms, preferably hydrogen atom, an alkyl group having 1 to 6 carbon atoms, an aralkyl group having 7 or 8 carbon atoms, an alkenyl group having 2 to 6 carbon atoms or an aryl group having 6 to 8 carbon atoms.

Also, it is desirable that $R^7$ is hydrogen atom, an alkyl group having 1 to 12 carbon atoms, an alkenyl group having 2 to 12 carbon atoms, preferably hydrogen atom, an alkyl group having 1 to 6 carbon atoms or an alkenyl group having 2 to 6 carbon atoms. Moreover, it is desirable that r is an integer of 1 to 30, preferably an integer of 1 to 15, more preferably an integer of 1 to 6.

It is desirable that the content of the alkylene oxide compound in the developer is 0.001 to 5.0% by weight, preferably 0.01 to 2.0% by weight, more preferably 0.01 to 0.5% by weight from the viewpoint of dissolution selectivity.

The developer of the present invention can be used in the developing process after the exposure process of a positive or negative resist. In particular, the developer can be preferably used in the process of lithography employed in the process for the production of semiconductor devices and liquid crystal display devices, which require fine resist patterns since the developer highly enhances the dissolution selectivity.

As a method for developing a substrate with the developer of the present invention, there can be employed, for instance, a method for developing each of substrates such as wafer with a spinner by means of a puddling process respectively, a method for developing some substrates at a time in a cassette by means of a dipping process, a method for developing a substrate comprising giving a substrate mechanical stress of the developer by means of spraying process or a process using the rotation of a spinner, and the like. Among those developing methods, it is desirable to employ the method for developing each of substrates by means of a puddling process respectively from the viewpoints of the reduction of consumption of the developer and the improvement of dissolution selectivity. The developing temperature is preferably 10° to 60° C., more preferably 15° to 30° C.

There is no limitation on the kinds of a resist to which the developer of the present invention is applied. Examples of the resist include, for instance, a positive resist containing an alkali-soluble novolak resin and a photodecomposition agent such as a naphthoquinone azide compound as its ingredients, a chemical amplification-type positive resist containing an alkali-insoluble resin such as p-tert-butoxycarbonyloxystyrene, and an acid-generating agent such as triphenylsulfonium triflate as its ingredients, a negative resist containing an alkali-soluble novolak resin and a photosensitive agent such as an azide compound as its ingredients, a chemical amplification-type negative resist containing an alkali-soluble polyvinylphenol resin or a novolak resin, an acid-reactive crosslinking agent such as a melanin or silanol acid-reactive crosslinking agent and a photoacid-generating agent as its ingredients, and the like.

The resist developer of the present invention shows excellent dissolution selectivity, that is, excellent properties for promoting the solubility of a resist to be dissolved and inhibiting the solubility of a resist not to be dissolved.

Accordingly, the developer forms precise fine patterns having a high resolution in a very short period of time.

EXAMPLES

The following examples illustrate the present invention but are not intended to limit the invention in any manner.

Examples 1 to 28

When TMAH is used as the basic organic compound A which is a main component of the developer, the resolution of the resist after the development greatly changes with the amount of TMAH freely existing in the developer.

The term "content of TMAH freely existing in the developer" described herein means the difference between the content of all of TMAH existing in the developer and the content of TMAH neutralized with the organic compound B existing in the developer.

Accordingly, the resolution of the resist based upon the ingredients other than TMAH can be evaluated without any effect of TMAH if the content of TMAH in the developer is maintained to be constant. The amount of TMAH to be added is the sum of the amount of TMAH freely existing in the developer and the amount of TMAH to be neutralized with the organic compound B.

In each example, a developer was prepared by mixing TMAH with a carboxylic acid as the organic compound B so that the content of TMAH freely existing in the developer became a predetermined value, and adding pure water to the resulting mixture to give a developer containing ingredients as shown in Table 1 or Table 2.

For instance, a developer containing 2.00% by weight of TMAH freely existing in the developer and 0.05% by weight of formic acid was prepared in the amount of 1000 g in a manner as explained below.

An amount of 20 g of TMAH necessary for preparing a developer containing 2.00% by weight of free TMAH, and an amount of 0.99 g of TMAH necessary for neutralizing the formic acid were dissolved in water to give 139.93 g of an aqueous solution of TMAH having a total TMAH content of 15% by weight. To the resulting aqueous solution, was added 0.50 g of formic acid and a balanced amount of pure water to give 1000 g of a developer containing 2.00% by weight of free TMAH.

The solubility of each carboxylic acid employed in Examples 1 to 28 to 100 parts by weight of a 2% by weight TMAH aqueous solution at 25° C. was at least 0.005 parts by weight, respectively. Also, the first dissociation constant of pKa of each carboxylic acid employed in Examples 1 to 28 at 25° C. was 0.5 to 6, respectively.

The properties of the developers against a positive photoresist were evaluated in accordance with the following methods.

A positive photoresist containing a novolak resin, a diazonaphthoquinone compound and a solvent was spread over a silicone wafer having 4 inch in diameter with a spinner. The silicone wafer was prebaked at 110° C. for 90 seconds with a hot plate to give a photoresist film having 1.5 $\mu$m in thickness.

The resist film was exposed to light through a test chart, using a minification-type projection exposing apparatus (stepper). Thereafter, the resist film was subjected to a paddle development with the developer at 23° C. for a predetermined period of time. The developed photoresist film was rinsed with pure water for 30 seconds, and then dried in a nitrogen gas stream.

The resist pattern formed on the silicone wafer was observed by means of a scanning electron microscope to evaluate the existence of a residual resist in the exposed region of the silicone wafer. In Table 1 and Table 2, the mark "○" shows that a residual resist was not observed, the mark "Δ" shows that a residual resist was observed a little, and the mark "x" shows that a residual resist was remarkably observed.

Also, the film thickness of the resist film which was not exposed to light was measured by an ellipsometer, and the residual ratio of the resist film in the region which was not exposed to light was calculated. The residual ratio of the resist film was determined by the difference between the thickness of the resist film before the development (1.5 μm) and the thickness of the resist film which was not exposed to light after the development. The results are shown in Tables 1 and 2.

The developer being excellent in dissolution selectivity does not remain residuals of the resist film in the region which is exposed to light, and shows a great residual ratio of the resist film in the region which is not exposed to light.

TABLE 1

| | Ingredients of developer (% by weight) | | | | Equivalent ratio of carboxylic acid/TMAH (−) | Developing period of time (seconds) | Residue of exposed resist film | Residual ratio of un-exposed resist (%) |
|---|---|---|---|---|---|---|---|---|
| | Content of TMAH | | | | | | | |
| Ex. No. | All of TMAH | Free TMAH | Carboxylic acid and its content | | | | | |
| 1 | 2.099 | 2.00 | Formic acid | 0.05 | 0.047 | 45 | ○ | 98.5 |
| 2 | 2.479 | 2.38 | Formic acid | 0.05 | 0.040 | 20 | ○ | 96.5 |
| 3 | 2.578 | 2.38 | Formic acid | 0.10 | 0.077 | 15 | ○ | 96.2 |
| 4 | 3.370 | 2.38 | Formic acid | 0.50 | 0.294 | 10 | ○ | 95.0 |
| 5 | 4.359 | 2.38 | Formic acid | 1.00 | 0.454 | 10 | ○ | 93.6 |
| 6 | 2.456 | 2.38 | Acetic acid | 0.05 | 0.031 | 30 | ○ | 96.5 |
| 7 | 2.532 | 2.38 | Acetic acid | 0.10 | 0.060 | 20 | ○ | 96.0 |
| 8 | 2.441 | 2.38 | Propionic acid | 0.05 | 0.025 | 30 | ○ | 96.5 |
| 9 | 2.419 | 2.38 | Caproic acid | 0.05 | 0.016 | 30 | ○ | 96.6 |
| 10 | 2.412 | 2.38 | Caprylic acid | 0.05 | 0.013 | 30 | ○ | 95.5 |
| 11 | 2.403 | 2.38 | Lauric acid | 0.05 | 0.009 | 20 | ○ | 93.7 |
| 12 | 2.443 | 2.38 | Acrylic acid | 0.05 | 0.026 | 30 | ○ | 96.5 |
| 13 | 2.433 | 2.38 | Vinylacetic acid | 0.05 | 0.022 | 30 | ○ | 97.5 |
| 14 | 2.412 | 2.38 | 2-Octenoic acid | 0.05 | 0.013 | 30 | ○ | 96.2 |
| 15 | 2.432 | 2.38 | Isobutyric acid | 0.05 | 0.021 | 30 | ○ | 96.0 |

TABLE 2

| | Ingredients of developer (% by weight) | | | | Equivalent ratio of carboxylic acid/TMAH (−) | Developing period of time (seconds) | Residue of exposed resist film | Residual ratio of un-exposed resist (%) |
|---|---|---|---|---|---|---|---|---|
| | Content of TMAH | | | | | | | |
| Ex. No. | All of TMAH | Free TMAH | Carboxylic acid and its content | | | | | |
| 16 | 2.412 | 2.38 | 2-Ethylhexanoic acid | 0.05 | 0.013 | 30 | ○ | 97.0 |
| 17 | 2.431 | 2.38 | Oxalic acid | 0.025 | 0.021 | 30 | ○ | 97.1 |
| 18 | 2.419 | 2.38 | Succinic acid | 0.025 | 0.016 | 30 | ○ | 97.3 |
| 19 | 2.706 | 2.38 | 1,2,3-Propanetricarboxylic acid | 0.21 | 0.120 | 15 | ○ | 97.0 |
| 20 | 2.707 | 2.38 | 1,2,3,4-Butanetetra carboxylic acid | 0.21 | 0.121 | 15 | ○ | 97.0 |
| 21 | 2.431 | 2.38 | Lactic acid | 0.05 | 0.021 | 30 | ○ | 97.5 |
| 22 | 2.431 | 2.38 | DL-Alanine | 0.05 | 0.021 | 30 | ○ | 95.0 |
| 23 | 2.431 | 2.38 | Methoxyacetic acid | 0.05 | 0.021 | 30 | ○ | 97.5 |
| 24 | 2.417 | 2.38 | Benzoic acid | 0.05 | 0.015 | 30 | ○ | 97.1 |
| 25 | 2.416 | 2.38 | Cyclohexanecarboxylic acid | 0.05 | 0.015 | 30 | ○ | 98.0 |
| 26 | 2.460 | 2.38 | Formic acid Propionic acid | 0.025 0.025 | 0.033 | 20 | ○ | 97.2 |
| 27 | 2.487 | 2.38 | Acetic acid Caprylic acid | 0.05 0.05 | 0.043 | 20 | ○ | 96.0 |
| 28 | 2.468 | 2.38 | Formic acid Succinic acid | 0.025 0.025 | 0.036 | 25 | ○ | 97.0 |

Examples 29 to 35

A resist developer was prepared in the same manner as in Example 1, and the development of a resist film was carried out in the same manner as in Example 1, except that an organic compound B listed in Table 3 was used instead of the carboxylic acid. The ingredients and results of evaluation of the resulting developer of each example are shown in Table 3.

Each of the organic compounds B used in Examples 29 to 35 had a solubility of at least 0.005 parts by weight at 25° C. per 100 parts by weight of a 2% by weight TMAH aqueous solution, respectively. Also, each of first dissociation constant of pKa of the organic compounds B was 0.5 to 6 at 25° C., respectively.

TABLE 3

| | Ingredients of developer (% by weight) | | | Equivalent ratio of organic compound | Developing period | Residue of exposed | Residual ratio of un-exposed |
|---|---|---|---|---|---|---|---|
| | Content of TMAH | | Organic | | | | |
| Ex. No. | All of TMAH | Free TMAH | compound B and its content | B/TMAH (—) | of time (seconds) | resist film | resist (%) |
| 29 | 2.411 | 2.38 | Monomethyl succinate | 0.05 | 0.013 | 30 | ○ | 97.0 |
| 30 | 2.405 | 2.38 | Acethyl-salioylic acid | 0.025 | 0.011 | 30 | ○ | 97.0 |
| 31 | 2.431 | 2.38 | Oxaminic acid | 0.05 | 0.021 | 35 | ○ | 97.5 |
| 32 | 2.408 | 2.38 | DL-Alanyl-DL-alanine | 0.05 | 0.012 | 25 | ○ | 95.0 |
| 33 | 2.440 | 2.38 | o-Thioacetic acid | 0.05 | 0.025 | 30 | ○ | 96.5 |
| 34 | 2.406 | 2.38 | Hexanebis-(thio acid) | 0.025 | 0.011 | 30 | ○ | 96.5 |
| 35 | 2.410 | 2.38 | Dithiobenzoic acid | 0.025 | 0.012 | 30 | ○ | 97.0 |

Comparative Examples 1 to 8

Some developers were prepared by mixing TMAH with water. The development of a resist film was carried with the resulting developers in the same manner as in Example 1. The ingredients and results of evaluation of the resulting developers are shown in Table 4.

TABLE 4

| | Ingredients of developer (% by weight) | | | Equivalent ratio of organic compound | Developing period | Residue of exposed | Residual ratio of un-exposed |
|---|---|---|---|---|---|---|---|
| | Content of TMAH | | Organic | | | | |
| Ex. No. | All of TMAH | Free TMAH | compound B and its content | B/TMAH (—) | of time (seconds) | resist film | resist (%) |
| 1 | 2.00 | 2.00 | — | — | 60 | X | 99.5 |
| 2 | 2.38 | 2.38 | — | — | 30 | X | 98.0 |
| 3 | 2.38 | 2.38 | — | — | 40 | Δ | 95.2 |
| 4 | 2.38 | 2.38 | — | — | 60 | ○ | 93.0 |
| 5 | 2.48 | 2.48 | — | — | 30 | Δ | 93.0 |
| 6 | 2.48 | 2.48 | — | — | 40 | ○ | 85.1 |
| 7 | 2.88 | 2.88 | — | — | 15 | ○ | 50.3 |
| 8 | 2.88 | 2.88 | — | — | 25 | ○ | 25.5 |

Examples 36 to 50

Some developers were prepared by adding a salt of a basic compound and a carboxylic acid as a salt C, to a TMAH aqueous solution containing a predetermined amount of TMAH, as shown in Table 5.

Each of the carboxylic acids used in Examples 36 to 50 had a solubility of at least 0.005 parts by weight at 25° C. per 100 parts by weight of a 2% by weight TMAH aqueous solution, respectively. The development of a resist film was carried out with the resulting developer in the same manner as in Example 1. The ingredients and results of evaluation of the resulting developers are shown in Table 5.

TABLE 5

| Ex. No. | Ingredients of developer (% by weight) | | Equivalent ratio of carboxylic acid/basic compound (–) | Developing period of time (seconds) | Residue of exposed resist film | Residual ratio of unexposed resist (%) |
|---|---|---|---|---|---|---|
| | Content of free TMAH | Salt of basic compound and carboxylic acid, and its content | | | | |
| 36 | 2.00 | Salt of TMAH and formic acid 0.50 | 0.143 | 35 | ◯ | 98.0 |
| 37 | 2.38 | Salt of TMAH and formic acid 0.10 | 0.027 | 20 | ◯ | 97.1 |
| 38 | 2.38 | Salt of TMAH and formic acid 0.50 | 0.123 | 15 | ◯ | 96.3 |
| 39 | 2.38 | Salt of TMAH and formic acid 1.00 | 0.218 | 10 | ◯ | 95.0 |
| 40 | 2.38 | Salt of TMAH and acetic acid 0.50 | 0.113 | 20 | ◯ | 96.2 |
| 41 | 2.38 | Salt of TMAH and caprylic acid 0.50 | 0.075 | 20 | ◯ | 94.1 |
| 42 | 2.38 | Salt of TMAH and acrylic acid 0.50 | 0.105 | 20 | ◯ | 96.2 |
| 43 | 2.38 | Salt of TMAH and isobutyric acid 0.50 | 0.097 | 20 | ◯ | 96.5 |
| 44 | 2.38 | Salt of TMAH and oxalic acid 0.50 | 0.123 | 20 | ◯ | 96.3 |
| 45 | 2.38 | Salt of TMAH and lactic acid 0.50 | 0.096 | 20 | ◯ | 97.1 |
| 46 | 2.38 | Salt of TMAH and DL-alanine 0.50 | 0.096 | 20 | ◯ | 95.0 |
| 47 | 2.38 | Salt of TMAH and benzoic acid 0.50 | 0.082 | 20 | ◯ | 97.4 |
| 48 | 2.38 | Salt of monoethanolamine and formic acid 0.50 | 0.152 | 25 | ◯ | 97.2 |
| 49 | 2.38 | Salt of ammonia and formic acid 0.50 | 0.233 | 30 | ◯ | 97.1 |
| 50 | 2.38 | Acrylic acid/maleic acid* 0.05 | 0.032 | 45 | ◯ | 94.5 |

Note:
*denotes a salt of acrylic acid-maleic acid copolymer having a weigh average molecular weight of 5000 (molar ratio of acrylic acid/maleic acid: 3/1 to 7/1) and calcium hydroxide.

As is clear from the above results, it can be seen that when a resist is developed with the resist developers obtained in Examples 1 to 50, which were prepared by adding the organic compound B or a salt thereof to a TMAH aqueous solution, the decrease of the resist film in the unexposed region was inhibited, and a resist pattern having high dissolution selectivity was formed as compared with the case where the developers obtained in Comparative Examples 1 to 8, each of which was composed of a TMAH aqueous solution, were used. Also, when the developers obtained in Examples 1 to 50 were used, the period of time necessary for the development could be shortened.

Also, from the results of Comparative Examples 1 to 8, it can be seen that the dissolution selectivity could not be enhanced even though the content of TMAH was increased because each of the developers was composed of a TMAH aqueous solution.

Example 51 and Comparative Example 9

A resist developer containing 2.38% by weight of free TMAH and 4% by weight of formic acid was prepared in the same manner as in Example 1 (Example 51).

Also, a resist developer composed of a TMAH aqueous solution containing 2.38% by weight of TMAH was prepared (Comparative Example 9).

The development of a resist film was carried out with the developer obtained in Example 51 or Comparative Example 9 in the same manner as in Example 1, except that the prebaking temperature was changed to 135° C. from 110° C.

As a result, when the developer obtained in Comparative Example 9 was used, it took three minutes for completing the development, and the residual ratio of the resist film in the unexposed region was 95.0% at the termination of the development.

To the contrary, when the developer obtained in Example 51 was used, it took a very short period of time of one minute for completing the development, and moreover, the residual ratio of the resist film in the unexposed region was as high as 97.0% at the termination of the development.

Examples 52 to 61 and Comparative Examples 10 to 11

Some developers were prepared, using choline as the basic organic compound A in the same manner as in the case where a developer was prepared using TMAH.

The development of a resist film was carried out with the resulting developers in the same manner as in Example 1. The ingredients and results of evaluation of the resulting developers are shown in Table 6.

TABLE 6

| | Ingredients of developer (% by weight) | | | Equivalent ratio of carboxylic acid/TMAH (–) | Developing period of time (seconds) | Residue of exposed resist film | Residual ratio of unexposed resist (%) |
|---|---|---|---|---|---|---|---|
| | Content of choline | | | | | | |
| | All of choline | Free choline | Carboxylic acid and its content | | | | |
| Ex. No. | | | | | | | |
| 52 | 4.532 | 4.4 | Formic acid 0.05 | 0.029 | 20 | ◯ | 96.5 |
| 53 | 4.501 | 4.4 | Acetic acid 0.05 | 0.022 | 30 | ◯ | 96.6 |

TABLE 6-continued

| | Ingredients of developer (% by weight) | | | | Equivalent ratio of carboxylic acid/TMAH (−) | Developing period of time (seconds) | Residue of exposed resist film | Residual ratio of unexposed resist (%) |
|---|---|---|---|---|---|---|---|---|
| | Content of choline | | | | | | | |
| | All of choline | Free choline | Carboxylic acid and its content | | | | | |
| 54 | 4.482 | 4.4 | Propionic acid | 0.05 | 0.018 | 30 | ○ | 95.6 |
| 55 | 4.484 | 4.4 | Acrylic acid | 0.05 | 0.019 | 30 | ○ | 96.5 |
| 56 | 4.469 | 4.4 | Isobutyric acid | 0.05 | 0.015 | 30 | ○ | 96.0 |
| 57 | 4.442 | 4.4 | 2-Ethylhexanoic acid | 0.05 | 0.010 | 30 | ○ | 97.0 |
| 58 | 4.451 | 4.4 | Succinic acid | 0.025 | 0.012 | 30 | ○ | 96.2 |
| 59 | 4.467 | 4.4 | Lactic acid | 0.05 | 0.015 | 30 | ○ | 96.7 |
| 60 | 4.468 | 4.4 | DL-Alanine | 0.05 | 0.015 | 30 | ○ | 95.2 |
| 61 | 4.450 | 4.4 | Benzoic acid | 0.05 | 0.011 | 30 | ○ | 97.0 |
| Comp. Ex. No. | | | | | | | | |
| 10 | 4.4 | 4.4 | — | | — | 30 | X | 97.5 |
| 11 | 4.4 | 4.4 | — | | — | 60 | ○ | 92.1 |

As is clear from the results, it can be seen that when a resist is developed with the developers obtained in Examples 52 to 61, the decrease of the resist film in the unexposed region can be inhibited, and a resist pattern having high dissolution selectivity can be formed as compared with the case where the developers obtained in Comparative Examples 10 to 11,. not containing the carboxylic acid, are used.

Also, when the developers obtained in Examples 52 to 61, the period of time necessary for completing the development could be shortened.

Examples 62 to 73 and Comparative Example 12

Using developers composed of a TMAH aqueous solution containing an alkylene oxide compound listed in Table 7 (Comparative Example 12), and developers prepared by adding an alkylene oxide compound listed in Table 7 to the developer obtained in Example 2, 9 or 16, the development of a resist was carried out in the same manner as in Example 1. The ingredients and results of evaluation of the resulting developers are shown in Table 7.

The abbreviations used in Table 7 are as follows: MG, ethyleneglycol monomethyl ether; BDG, diethyleneglycol monobutyl ether; BEDG, diethyleneglycol monobutylethyl ether; HDG, diethyleneglycol monohexyl ether; EPE, lauryl ether of a block copolymer of 5 mol of ethylene oxide and 5 mol of propylene oxide; EGEO, polyethylene glycol (ethylene oxide is added); PhDG, diethyleneglycol monophenyl ether; POEH, polyoxyethylene hexyl ether acetate (6 mol of ethylene oxide is added); POEB, polyoxyethylene butylamine (10 mol of ethylene oxide is added); EOPO, ethylene oxide-propylene oxide copolymer (ethylene oxide/ propylene oxide (molar ratio): 7/1, average molecular weight: about 3000, Pluronic-type).

TABLE 7

| | Ingredients of developer (% by weight) | | | | | Developing period of time (seconds) | Residue of exposed resist film | Residual ratio of unexposed resist (%) |
|---|---|---|---|---|---|---|---|---|
| | Content of free TMAH | Alkylene oxide compound and its content | | Carboxylic acid and its content | | | | |
| Ex. No. | | | | | | | | |
| 62 | 2.38 | MG | 0.05 | Formic acid | 0.05 | 17 | ○ | 98.5 |
| 63 | 2.38 | MG | 2.00 | Formic acid | 0.05 | 13 | ○ | 97.5 |
| 64 | 2.38 | BDG | 0.01 | Formic acid | 0.05 | 17 | ○ | 97.5 |
| 65 | 2.38 | BDG | 0.10 | Formic acid | 0.05 | 13 | ○ | 98.5 |
| 66 | 2.38 | BEDG | 0.10 | Formic acid | 0.05 | 15 | ○ | 98.0 |
| 67 | 2.38 | HDG | 0.10 | Capronic acid | 0.05 | 21 | ○ | 98.0 |
| 68 | 2.38 | EPE | 0.01 | Formic acid | 0.05 | 17 | ○ | 97.0 |
| 69 | 2.38 | EGEO | 0.05 | Formic acid | 0.05 | 17 | ○ | 98.0 |
| 70 | 2.38 | PhDG | 0.05 | Formic acid | 0.05 | 15 | ○ | 97.0 |
| 71 | 2.38 | POEH | 0.05 | 2-Ethylhexanoic acid | 0.05 | 26 | ○ | 97.5 |
| 72 | 2.38 | POEB | 0.05 | Formic acid | 0.05 | 15 | ○ | 97.5 |
| 73 | 2.38 | EOPO | 0.01 | Formic acid | 0.05 | 17 | ○ | 97.0 |

TABLE 7-continued

| | Ingredients of developer (% by weight) | | | Developing period of time (seconds) | Residue of exposed resist film | Residual ratio of unexposed resist (%) |
|---|---|---|---|---|---|---|
| | Content of free TMAH | Alkylene oxide compound and its content | Carboxylic acid and its content | | | |
| Comp. Ex. No. | | | | | | |
| 12 | 2.38 | EOPO   0.05 | — | 56 | ◯ | 85.2 |

As is clear from the results shown in Table 7, it can be seen that when the resist is developed with the resist developers obtained in Examples 62 to 73, the decrease of the resist film in the unexposed region is inhibited, and a resist pattern having high dissolution selectivity can be formed, as compared with the case where the developer obtained in Comparative Example 12, which was prepared from an alkylene oxide compound and a TMAH aqueous solution, are used. Also, when the developers obtained in Examples 62 to 73 were used, the period of time necessary for the development could be shortened.

Examples 74 to 91 and Comparative Examples 13 to 17

Using the developers made of the TMAH aqueous solution, and the resist developers obtained in Examples 1 to 4, 6, 8, 9, 11, 12, 16 and 18 to 25, a chemical amplification-type negative resist prepared from polyvinylphenol, a melanin compound, a bromic photosensitive acid-generating agent and a solvent was developed. Evaluation of development was carried out in accordance with the following method.

The chemical amplification-type negative resist was spread over a silicone wafer having 4 inch in diameter with a spinner. The silicone wafer was prebaked at 125° C. for 60 seconds with a hot plate to give a photoresist film having 1.0 μm in thickness.

To the photoresist film, a laser beam was irradiated through a test chart, using a KrF excimer laser system. Thereafter, the photoresist film was baked at 130° C. for 60 seconds with a hot plate.

The baked photoresist film was subjected to a paddle development with the developer at 23° C. for a predetermined period of time. The developed photoresist film was rinsed with pure water for 30 seconds, and then dried in a nitrogen gas steam.

The resist pattern formed on the silicone wafer was observed by means of a scanning electron microscope to evaluate the existence of a residual resist in the unexposed region of the resist film in the same manner as in Examples 1 to 28.

Also, the film thickness of the resist film in the exposed region was measured by an ellipsometer and the residual ratio of the resist film in the exposed region was calculated. The residual ratio was determined by the difference between the thickness of the original resist film (1.0 μm) and the thickness of the exposed resist film. The results are shown in Table 8.

The developer being excellent in dissolution selectivity does not remain a residual resist film in the unexposed region of the resist film, and shows a high residual ratio of the resist film in the exposed region.

TABLE 8

| | Ingredients of developer (% by weight) | | | | Equivalent ratio of carboxylic acid/TMAH (-) | Developing period of time (seconds) | Residue of exposed resist film | Residual ratio of unexposed resist (%) |
|---|---|---|---|---|---|---|---|---|
| | Content of TMAH | | | | | | | |
| | All of TMAH | Free TMAH | Carboxylic acid and its content | | | | | |
| Ex. No. | | | | | | | | |
| 74 | 2.099 | 2.00 | Formic acid | 0.05 | 0.047 | 52 | ◯ | 99.0 |
| 75 | 2.479 | 2.38 | Formic acid | 0.05 | 0.040 | 23 | ◯ | 97.0 |
| 76 | 2.578 | 2.38 | Formic acid | 0.10 | 0.077 | 18 | ◯ | 96.7 |
| 77 | 3.370 | 2.38 | Formic acid | 0.50 | 0.294 | 12 | ◯ | 95.5 |
| 78 | 2.456 | 2.38 | Acetic acid | 0.05 | 0.031 | 35 | ◯ | 97.0 |
| 79 | 2.441 | 2.38 | Propionic acid | 0.05 | 0.025 | 35 | ◯ | 96.5 |
| 80 | 2.419 | 2.38 | Capronic acid | 0.05 | 0.016 | 35 | ◯ | 97.1 |
| 81 | 2.403 | 2.38 | Lauric acid | 0.05 | 0.009 | 23 | ◯ | 95.0 |
| 82 | 2.443 | 2.38 | Acrylic acid | 0.05 | 0.026 | 35 | ◯ | 97.0 |
| 83 | 2.412 | 2.38 | 2-Ethylhexanoic acid | 0.05 | 0.013 | 35 | ◯ | 97.5 |
| 84 | 2.419 | 2.38 | Succinic acid | 0.025 | 0.016 | 35 | ◯ | 97.8 |

TABLE 8-continued

| | Ingredients of developer (% by weight) | | | | Equivalent ratio of carboxylic acid/TMAH (-) | Developing period of time (seconds) | Residue of exposed resist film | Residual ratio of unexposed resist (%) |
|---|---|---|---|---|---|---|---|---|
| | Content of TMAH | | | | | | | |
| | All of TMAH | Free TMAH | Carboxylic acid and its content | | | | | |
| 85 | 2.706 | 2.38 | 1,2,3-Propanetricarboxylic acid | 0.21 | 0.120 | 18 | O | 97.0 |
| 86 | 2.707 | 2.38 | 1,2,3,4-Butanetetracarboxylic acid | 0.21 | 0.121 | 20 | O | 96.7 |
| 87 | 2.431 | 2.38 | Lactic acid | 0.05 | 0.021 | 35 | O | 97.0 |
| 88 | 2.431 | 2.38 | DL-Alanine | 0.05 | 0.021 | 35 | O | 96.5 |
| 89 | 2.431 | 2.38 | Methoxyacetic acid | 0.05 | 0.021 | 35 | O | 97.0 |
| 90 | 2.417 | 2.38 | Benzoic acid | 0.05 | 0.015 | 35 | O | 97.6 |
| 91 | 2.416 | 2.38 | Cyclohexanecarboxylic acid | 0.05 | 0.015 | 35 | O | 97.5 |
| Comp. Ex. No. | | | | | | | | |
| 13 | 2.00 | 2.00 | — | | — | 70 | X | 100.0 |
| 14 | 2.38 | 2.38 | — | | — | 35 | X | 98.5 |
| 15 | 2.38 | 2.38 | — | | — | 70 | O | 94.0 |
| 16 | 2.48 | 2.48 | — | | — | 35 | Δ | 93.5 |
| 17 | 2.48 | 2.48 | — | | — | 46 | O | 85.5 |

As is clear from the results shown in Table 8, when the developers obtained in Examples 74 to 91, which were prepared by adding a carboxylic acid to a TMAH aqueous solution, were used to develop a resist, the decrease of the resist film in the unexposed region is inhibited, and a resist pattern having high dissolution selectivity can be formed, as compared with the case where the developers obtained in Comparative Examples 13 to 17, which were only composed of a TMAH aqueous solution, are used.

Also, when the developers obtained in Examples 74 to 91 were used, the period of time necessary for the development could be shortened.

Moreover, as is clear from the results of Comparative Examples 13 to 17, it can be seen that the developer only composed of a TMAH aqueous solution does not enhance the dissolution selectivity even though the content of TMAH is increased.

As explained above, the resist developer of the present invention promotes the solubility of a resist to be dissolved, and inhibits the solubility of a resist not to be dissolved.

Accordingly, the resist developer of the present invention is excellent in dissolution selectivity.

Moreover, the resist developer can shorten the period of time necessary for the development.

Those skilled in the art will recognize, or be able to ascertain using no more than routine experimentation, many equivalents to the specific embodiments of the present invention described specifically herein. Such equivalents are intended to be encompassed in the scope of the following claims.

What is claimed is:

1. A method for developing a resist, comprising:
   developing the resist with a resist developer comprising
   (1) a basic organic compound A; and
   (2) a salt C of (a) the basic organic compound A and (b) an organic compound B capable of forming a salt together with said basic organic compound A, in a process of lithography employed in a process for production of a semiconductor device or a liquid crystal display device;
   wherein said resist developer is prepared by combining (1) and (2), or, by reacting an amount of said basic organic compound A in excess of that necessary to form said salt C with said organic compound B;
   wherein an equivalent ratio of total amount of basic organic compound A to total amount of organic compound B is 1:0.001 to 1:0.80.

2. The method according to claim 1, wherein said organic compound B is a compound having a carboxyl group.

3. The method according to claim 2, wherein said compound having a carboxyl group is a compound represented by formula (I):

$$A-[(R^1)_k-(COOH)_m]_n \qquad (I)$$

wherein $R^1$ is a hydrogen atom, a saturated or unsaturated hydrocarbon group having a linear, branched or cyclic skeleton of 1 to 40 carbon atoms; hydrogen atom bonded to carbon atom $R^1$ may be substituted with —OH group, —NH$_2$ group, —SH group or —NO$_2$ group; each of —COOH groups may be bonded to the same carbon atom of $R^1$; k is 0 or 1; m is an integer of 1 to 40; n is an integer of 1 to 3; A is —O— group, —CO— group, —NH— group, —S— group or

group, or is not present.

4. The method according to claim 2, wherein said compound having a carboxyl group is a carboxylic acid having a heterocyclic ring.

5. The method according to claim 1, wherein said basic organic compound A is at least one compound selected from the group consisting of a primary amine, a secondary amine, a tertiary amine, an imine, an alkanol amine, an amide, a basic heterocyclic compound and a quaternary ammonium hydroxide.

6. The method according to claim 5, wherein said quaternary ammonium hydroxide is a compound represented by formula (II):

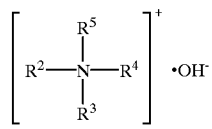

wherein each of $R^2$, $R^3$, $R^4$ and $R^5$ is independently an alkyl group having 1 to 6 carbon atoms, an aralkyl group having 7 or 8 carbon atoms, an alkenyl group having 2 to 6 carbon atoms, an aryl group having 6 to 8 carbon atoms, a hydroxyalkyl group having 1 to 6 carbon atoms or an alkoxyalkyl group having 2 to 6 carbon atoms.

7. The method according to claim 1, wherein said resist developer further comprises an alkylene oxide compound.

8. The method of claim 1, wherein said basic organic compound A is tetramethyl ammonium hydroxide.

9. The method of claim 1, wherein said basic organic compound A is trimethyl hydroxy ethyl ammonium hydroxide.

10. The method according to claim 1, wherein a sum of the content of the organic compound B and the content of the organic compound B constituting the salt C is 0.001 to 4% by weight.

11. The method according to claim 1, wherein an equivalent ratio of total amount of basic organic compound A to total amount of organic compound B is 1:0.01 to 1:0.50.

12. The method according to claim 1, wherein said organic compound B has a molecular weight of 46 to 200.

13. The method according to claim 1, wherein a sum of the content of the organic compound B and the content of the organic compound B constituting the salt C is greater than or equal to 0.05 wt. % but less than 1 wt. %.

* * * * *